United States Patent
Pyeon

(10) Patent No.: US 7,965,550 B2
(45) Date of Patent: *Jun. 21, 2011

(54) MULTI-LEVEL CELL ACCESS BUFFER WITH DUAL FUNCTION

(75) Inventor: Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 71 days.

This patent is subject to a terminal disclaimer.

(21) Appl. No.: 12/499,577

(22) Filed: Jul. 8, 2009

(65) Prior Publication Data

US 2009/0273973 A1    Nov. 5, 2009

Related U.S. Application Data

(63) Continuation of application No. 11/966,152, filed on Dec. 28, 2007, now Pat. No. 7,577,029.

(60) Provisional application No. 60/916,151, filed on May 4, 2007.

(51) Int. Cl.
*G11C 16/00* (2006.01)
(52) U.S. Cl. .............. 365/185.03; 365/189.05
(58) Field of Classification Search .......... 327/202, 327/208
See application file for complete search history.

(56) References Cited

U.S. PATENT DOCUMENTS

| | | | |
|---|---|---|---|
| 4,680,491 A | 7/1987 | Yokouchi et al. | |
| 5,109,361 A | 4/1992 | Yim et al. | |
| 5,257,223 A * | 10/1993 | Dervisoglu | 365/154 |
| 5,299,162 A | 3/1994 | Kim et al. | |
| 5,473,563 A | 12/1995 | Suh et al. | |
| 5,541,879 A | 7/1996 | Suh et al. | |
| 5,546,341 A | 8/1996 | Suh et al. | |
| 5,631,866 A | 5/1997 | Oka et al. | |
| 5,671,178 A | 9/1997 | Park et al. | |
| 5,687,134 A | 11/1997 | Sugawara et al. | |
| 5,732,018 A | 3/1998 | Choi et al. | |
| 5,835,935 A | 11/1998 | Estakhri et al. | |
| 5,937,425 A | 8/1999 | Ban | |
| 5,995,417 A | 11/1999 | Chen et al. | |
| 6,058,059 A | 5/2000 | Huang et al. | |
| 6,111,787 A | 8/2000 | Akaogi et al. | |
| 6,118,705 A | 9/2000 | Gupta et al. | |

(Continued)

FOREIGN PATENT DOCUMENTS

EP          1134746          9/2001

OTHER PUBLICATIONS

Samsung Electronics Co., Ltd., "Samsung Announces First 40-nanometer Device—32 Gb NAND Flash with Revolutionary Charge Trap Technology," World Press Release, Sep. 11, 2006, pp. 1-2.

(Continued)

*Primary Examiner* — Tan T. Nguyen

(57) ABSTRACT

An access buffer, such as page buffer, for writing to non-volatile memory, such as Flash, using a two-stage MLC (multi-level cell) operation is provided. The access buffer has a first latch for temporarily storing the data to be written. A second latch is provided for reading data from the memory as part of the two-stage write operation. The second latch has an inverter that participates in the latching function when reading from the memory. The same inverter is used to produce a complement of an input signal being written to the first latch with the result that a double ended input is used to write to the first latch.

16 Claims, 8 Drawing Sheets

U.S. PATENT DOCUMENTS

| | | | |
|---|---|---|---|
| 6,151,257 | A | 11/2000 | Jeffrey et al. |
| 6,208,556 | B1 | 3/2001 | Akaogi et al. |
| 6,256,254 | B1 | 7/2001 | Kwak et al. |
| 6,278,636 | B1 | 8/2001 | Lee |
| 6,359,810 | B1 | 3/2002 | Gupta et al. |
| 6,456,528 | B1 | 9/2002 | Chen |
| 6,483,742 | B1 | 11/2002 | Sweha et al. |
| 6,522,580 | B2 | 2/2003 | Chen et al. |
| 6,594,183 | B1 | 7/2003 | Lofgren et al. |
| 6,671,204 | B2 | 12/2003 | Im |
| 6,717,857 | B2 | 4/2004 | Byeon et al. |
| 6,732,221 | B2 | 5/2004 | Ban |
| 6,763,424 | B2 | 7/2004 | Conley |
| 6,788,589 | B2 * | 9/2004 | Faue ............ 365/189.05 |
| 6,804,148 | B2 | 10/2004 | Bedarida et al. |
| 6,807,103 | B2 | 10/2004 | Cavaleri et al. |
| 6,826,082 | B2 | 11/2004 | Hwang et al. |
| 6,885,583 | B2 | 4/2005 | Tanaka |
| 6,963,509 | B1 | 11/2005 | Ju |
| 7,016,229 | B2 | 3/2006 | Kim |
| 7,042,770 | B2 | 5/2006 | Lee et al. |
| 7,046,554 | B2 | 5/2006 | Lee |
| 7,061,813 | B2 | 6/2006 | Lee |
| 7,082,056 | B2 | 7/2006 | Chen et al. |
| 7,099,213 | B2 | 8/2006 | Ju |
| 7,111,122 | B2 | 9/2006 | Noro et al. |
| 7,149,130 | B2 | 12/2006 | Lee |
| 7,180,784 | B2 | 2/2007 | Ju |
| 7,200,044 | B2 * | 4/2007 | Won et al. ............ 365/185.22 |
| 7,548,103 | B2 * | 6/2009 | Ramaraju et al. ............ 327/218 |
| 7,863,959 | B2 * | 1/2011 | Chan et al. ............ 327/208 |
| 2004/0080979 | A1 | 4/2004 | Park |
| 2005/0232008 | A1 | 10/2005 | Shukuri et al. |
| 2005/0232011 | A1 | 10/2005 | Lee et al. |
| 2005/0232025 | A1 | 10/2005 | Ju |
| 2006/0133155 | A1 | 6/2006 | Fujita et al. |
| 2006/0193169 | A1 | 8/2006 | Nazarian |
| 2007/0002623 | A1 | 1/2007 | Won et al. |

OTHER PUBLICATIONS

Aritome, S. et al., "A Reliable Bi-Polarity Write/Erase Technology in Flash EEPROMS", Int'l Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, (1990), pp. 103-106.

Jung et al., "A 3.3V 128Mb Multi-Level NAND Flash Memory for Mass Storage Applications," 1996 IEEE International Solid-State Circuits Conference, Digest of Technical Papers, Feb. 1996, pp. 32-33.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Lee, S. et al., "A 3.3V 4Gb Four-Level NAND Flash Memory with 90nm CMOS Technology", ISSCC 2004/Session 2 Non-Volatile Memory/2.7, IEEE International Solid-State Circuits Conference, Feb. 15-19, 2004,Digest of Technical Papers, pp. 52-513, vol. 1, XP010722148, ISBN: 0-7803-8267-6.

Kirisawa, R. et al., "A NAND Structured Cell with a new Programming Technology for Highly Reliable 5V-Only Flash EEPROM", 1990 Symposium on VLSI Technology, Jun. 4, 1990, CH 2874-6, 90/0000-0129 1990 IEEE, Honolulu, US pp. 129-130.

Cho, et al., "A 3.3 V 1 Gb Multilevel NAND Flash Memory with Non-Uniformthreshold Voltage Distribution", Solid State Circuits Conference, 2001, Digest of Technical Papers, ISSCC, 2001 IEEE International, Feb. 5, 2001, pp. 28-29.

Kim, "Multilevel Flash Memory Cell with Balanced Cell Vth", MOSAID Technologies Incorporated, Mar. 14, 2006, pp. 1-27.

Momodomi, M. et al., "A 4 Mb NAND EEPROM with tight programmed Vt Distribution", IEEE Journal of Solid-State Circuits, vol. 26, Issue 4, Apr. 1991, pp. 492-496.

Kim, et al. "A 120-mm2 64 Mb NAND Flash Memory Archieving 180 ns/Byte Effective Program Speed," IEEE Journal of Solid-State Circuits, vol. 32, No. 5, May 1977, pp. 670-680.

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

Samsung Electronics Co. Ltd, "256M x 8 Bit / 128 M x 16 Bit / 512M x 8 Bit NAND Flash Memory", K9K4G08U1M, May 6, 2005, pp. 1-41.

Gal, et al., "Algorithms and data structures for flash memories", ACM Computing Surveys (CSUR), vol. 37, No. 2, p. 138-163, Jun. 2005, Tel Aviv University.

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Toshiba, "2GBIT (256M × 8 Bits) CMOS NAND E2PROM", TH58NVG1S3AFT05, May 19, 2003, pp. 1-32.

A 56nm CMOS 99mm2 8-Gb Multi-level NAND Flash Memory with 10Mbyte/sec program throughput (2006 ISSCC; file name: V07-07).

An 8-Gb Multi-level NAND flash memory with 63nm STI CMOS process technology (2005 ISSCC; file name: Samsung_V02-02, 02-02).

Ken Takeuchi et al.; A Multipage Cell Architecture for High-Speed Programming Multilevel NAND Flash Memories; IEEE J Solid-State Circuits, vol. 33, No. 8, pp. 1228-1238, Aug. 1998.

Supplementary European Search Report dated May 12, 2010 from European Patent Application No. 08748199 (1 page).

* cited by examiner

MULTI-LEVEL CELL ACCESS BUFFER WITH DUAL FUNCTION

CROSS REFERENCE TO RELATED APPLICATIONS

This application is a continuation of application Ser. No. 11/966,152 filed Dec. 28, 2007 which claims the benefit of prior U.S. Provisional Patent Application No. 60/916,151 filed May 4, 2007, which are hereby incorporated by reference in their entirety.

FIELD OF THE INVENTION

The invention relates to MLC (multi-level cell) memories, and to buffers for use in accessing such MLC memories.

BACKGROUND OF THE INVENTION

Flash memories, for example NAND flash devices, have become a key enabling technology for consumer applications and mobile storage applications such as flash cards, digital audio & video players, cell phones, USB flash drivers and solid state disks for HDD replacement. The density requirement is increasing and for example, NAND flash provides high density with low cost. For this reason, a great deal of attention has been paid to multilevel flash memories. In multilevel memory, rather than selecting between two levels to store a two state information element (a bit) in each cell, additional levels are employed to allow selecting between information elements having more than two states for each cell. For example, four levels can be used to represent a four state information element, and a four state information element can contain two bits. The memory cell density can be doubled without a die size increase if the four levels of data can be stored in one memory cell instead of two.

A two-level flash memory cell stores one of two logic states: data '1' and data '0', and the contents of each memory cell correspond to one bit. The conventional two-level flash memory cell can have one of two threshold voltages corresponding to data '1' and data '0'. The threshold voltage distribution of a single level cell (SLC) in a NAND flash is shown in FIG. 1. Shown is a distribution 50 for a first cell state, and a distribution 52 for a second cell state. In this example, the cell states are assigned to data '1' and data '0', respectively (or vice versa). The '1' state denotes that the cell turns on and can flow current. On the other hand, the '0' indicates that the cell turns off and can not flow current. With only two states and one bit of data stored, SLC NAND Flash's Control Logic is able to conserve energy when managing the electrical charge during operations.

A four level flash memory cell stores one of four logic states, and the contents of each memory cell correspond to two bits. The four level flash memory cell can have one of four threshold voltages corresponded to data '11', data '10', data '00' and data '01'. The threshold voltage distribution of a four-level MLC in a NAND flash is shown in FIG. 2. Shown are distributions 60,62,64,66 for four cell states. In this example, the cell states are assigned to data '11', data '10', data '00' and data '01' respectively. This employs the row direction assignment of two bits proposed by Ken Takeuchi, as described in U.S. Pat. No. 6,885,583 hereby incorporated by reference in its entirety. The two bits represent an upper page bit and a lower page bit. Thus:

the cell assigned to data '11' has Upper page=1 and Lower page=1;
the cell assigned to data '10' has Upper page=1 and Lower page=0;
the cell assigned to data '00' has Upper page=0 and Lower page=0; and
the cell assigned to data '01' has Upper page=0 and Lower page=1.

SUMMARY OF THE INVENTION

According to one broad aspect, the invention provides an access buffer for writing to a non-volatile memory, the access buffer comprising: a single-ended input for receiving a single-ended input signal having an input bit to be written to the memory; a first latch for latching the input bit, the first latch having a double-ended input for receiving a double-ended input signal containing the input bit; a second latch for latching a value read from a lower page of a memory location of the non-volatile memory; and a complement signal producer for producing a complement of the single-ended input signal, the double-ended input signal comprising the complement of the single-ended input signal and the single-ended input signal.

In some embodiments, the access buffer has a first mode of operation in which the complement signal producer is producing the complement of the single-ended input signal and has a second mode of operation in which the second latch is functioning as a latch; wherein the access buffer operates in the first mode of operation while receiving the input bit and latches the input bit into the first latch, and operates in the second mode of operation during multi-level cell programming.

In some embodiments, the access buffer further comprises a driving inverter that forms part of both the second latch and the complement signal producer, the second latch further including a feedback data holder, the driving inverter and the feedback data holder being connected in a latch configuration.

In some embodiments, the feedback data holder comprises a PMOS transistor, and the driving inverter has an input connected to a drain of the transistor, the transistor having a gate connected to an output of the driving inverter, wherein the transistor holds data high so as to avoid interference with the driving inverter while the access buffer is operating in the first mode of operation.

In some embodiments, the access buffer further comprises: a pre-charging PMOS transistor for pre-charging the input of the driving inverter.

In some embodiments, the complement signal producer comprises: a first signal passer for passing the single-ended input signal to the driving inverter while the access buffer is in the first mode of operation, and that prevents passage of the input signal to the driving inverter while the access buffer is in the second mode of operation; a second signal passer for passing the output of the driving inverter as one end of the double-ended input signal to the first latch while the access buffer is in the first mode of operation, and that prevents passage of the output of the driving inverter as one end of the double-ended input signal to the first latch while the access buffer is in the second mode of operation.

In some embodiments, the access buffer further comprises: a third signal passer for passing the output of the memory to the input of the second latch circuit while the access buffer is in the second mode, and that does not affect the output of the memory while the access buffer is in the first mode.

In some embodiments, each of the first, second and third pass circuits comprise a respective NMOS transistor.

In some embodiments, a drain of the NMOS transistor is connected to receive the input from the memory, and a gate the NMOS transistor is connected to the input of the second latch.

In some embodiments, the non-volatile memory comprises a flash memory, the flash memory having a page buffer as the access buffer.

According to another broad aspect, the invention provides a method for writing to a non-volatile memory, the method comprising: receiving a single-ended input signal having an input bit to be written to the memory; producing a complement of the single-ended input signal using an input inverter comprising a driving inverter, the complement of the single-ended input signal and the single-ended input signal in combination forming a double-ended input signal; latching the input bit into a first latch having a double-ended input for receiving a double-ended input signal containing the input bit; and latching a value read from a lower page of a memory location of the non-volatile memory into a second latch comprising the driving inverter.

In some embodiments, the method further comprises: while receiving the input bit and latches the input bit into the first latch, operating the access buffer in a first mode of operation in which the input inverter is producing the complement of the single-ended input signal; and during multi-level cell programming, operating the access buffer in a second mode of operation in which the second latch is functioning as a latch.

In some embodiments, the method further comprises precharging an input of the driving inverter.

In some embodiments, the method further comprises: passing the single-ended input signal to the driving inverter while the access buffer is in the first mode of operation, and preventing passage of the input signal to the driving inverter while the access buffer is in the second mode of operation; passing the output of the driving inverter as one end of the double-ended input signal to the first latch while the access buffer is in the first mode of operation, and preventing passage of the output of the driving inverter as one end of the double-ended input signal to the first latch while the access buffer is in the second mode of operation.

In some embodiments, the method further comprises: passing the output of the memory to the input of the second latch circuit while the access buffer is in the second mode.

According to another broad aspect, the invention provides a memory system having an access buffer for writing to a non-volatile memory structure, the access buffer comprising: a single-ended input for receiving a single-ended input signal having an input bit to be written to the memory structure; a first latch for latching the input bit, the first latch having a double-ended input for receiving a double-ended input signal containing the input bit; a second latch for latching a value read from a lower page of a memory location of the non-volatile memory structure; and a complement signal producer for producing a complement of the single-ended input signal, the double-ended input signal comprising the complement of the single-ended input signal and the single-ended input signal.

In some embodiments, the non-volatile memory structure comprises a memory cell array.

In some embodiments, the memory cell array comprises a flash memory cell string including a plurality of floating gate memory cells connected in-series, the series connected memory cells being coupled to a bitline, the memory cells being coupled to respective wordlines.

In some embodiments, the non-volatile memory comprises a flash memory, the flash memory having a page buffer as the access buffer.

BRIEF DESCRIPTION OF THE DRAWINGS

Embodiments of the invention will now be described with reference to the attached drawings in which.

DETAILED DESCRIPTION

Figure 1:
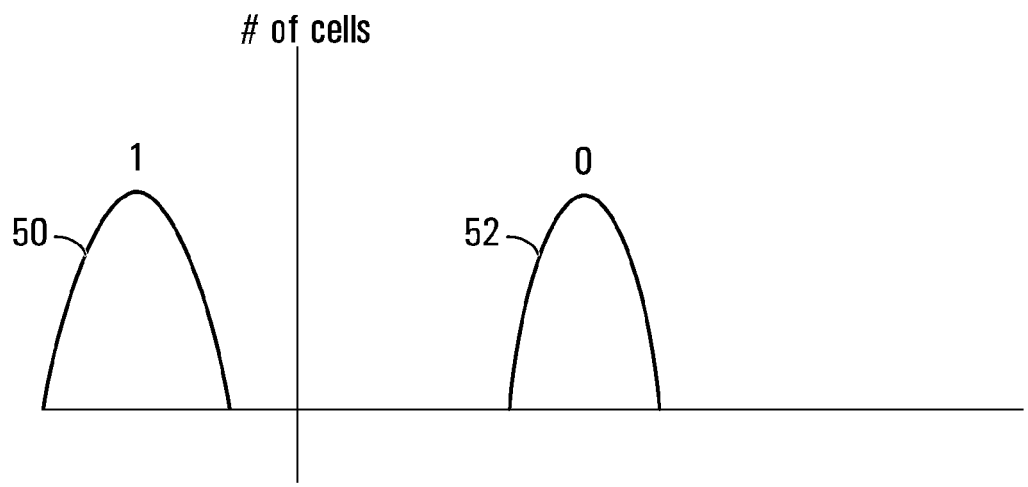
FIG. 1 is a threshold distribution for SLC bit positions.
Figure 2:
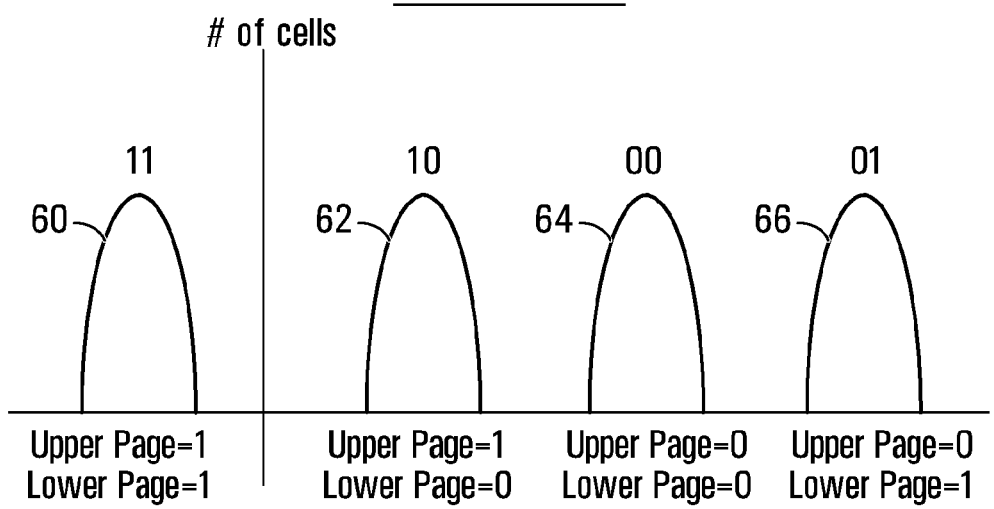
FIG. 2 shows threshold distributions for MLC bit positions.
Figure 3:
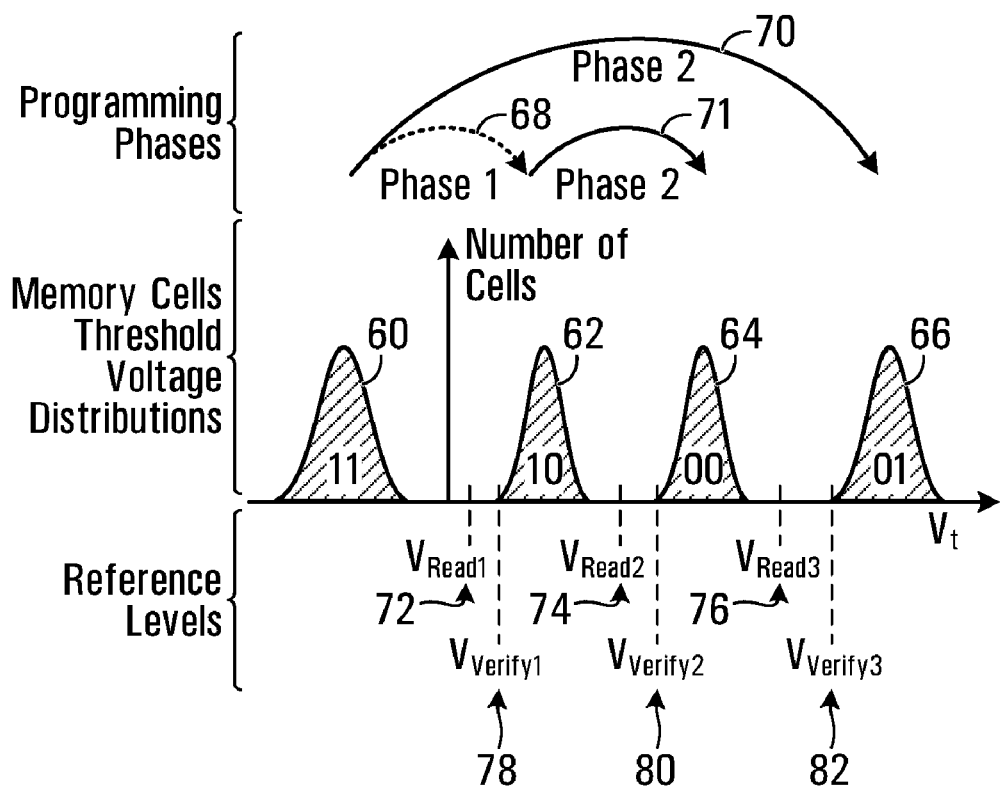
FIG. 3 shows threshold distributions for MLC bit positions, and the acceptable transitions for programming.

FIG. 3 shows a set of permitted programming operations in an MLC memory having the bit mapping of FIG. 2 where the distributions referred to above are again shown at 60,62,64, 66. A "programming" operation in Flash memory changes a "1" to a "0". In MLC flash, programming starts with the lower page, and this is followed by the upper page. The starting point for a cell is distribution 60, this being an erase state.

When storing to the lower page, if the bit is a "1", then nothing need be done, as this is consistent with the erase state. If the bit is a "0", then the cell must be programmed to the second distribution 62, as indicated at 68. This is a first phase of programming.

When storing to the upper page, it is necessary to know what is in the lower page first. The possible transitions are indicated in FIG. 3:

if the lower page is "1", the current distribution is 60, then if the bit to be written to the upper page is "1" then nothing need be done, as this is consistent with the erase state;

if the lower page is "1", the current distribution is 60, then if the bit to be written to the upper page is a "0", then the cell must be programmed to the fourth distribution 66, as indicated at 70. This is part of a second phase of programming;

if the lower page is "0", the current distribution is 62, then if the bit to be written to the upper page is "1" then nothing need be done, as this is consistent with distribution 62;

if the lower page is "0", the current distribution is 62, then if the bit to be written to the upper page is a "0", then the cell must be programmed to the third distribution 64, as indicated at 71. This is part of the second phase of programming.

Read thresholds are indicated at 72,74,76, while program verify thresholds are indicated at 78,80,82. The read and program verify operations have different voltage levels to read or judge the cell threshold level. The reason that there is a difference between read and program verify is to ensure the voltage margin among the four states. The program verify operation is required to check whether or not the selected cell on the page is fully programmed if the data is '0'. The level should be tightly controlled to guarantee enough voltage distance between adjacent threshold states.

Figure 4:
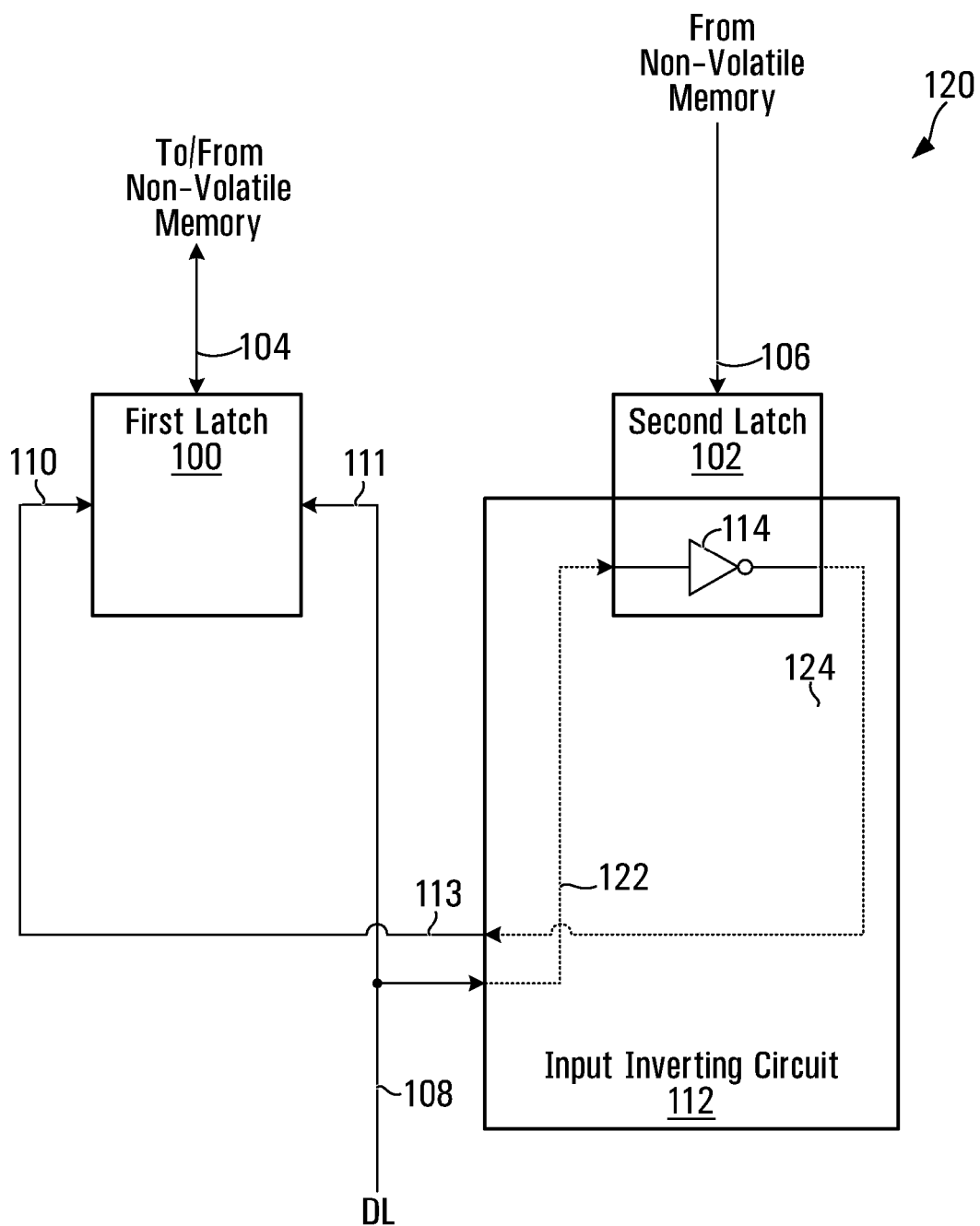
FIG. 4 is a block diagram of a page buffer provided by an embodiment of the invention.

FIG. 4 shows an access buffer according to an embodiment of the present invention. The access buffer generally indicated at 120 is for writing to a memory (e.g., a non-volatile memory). The access buffer 120 has a single-ended input 108 connected to a dataline (DL) for receiving a single-ended input signal having an input bit to be written to a non-volatile memory (not shown) such as, for example, a Flash memory. There is a first latch circuit 100 for latching the input bit before outputting the input bit for storage in the memory to either the lower page or the upper page of a selected cell. The first latch circuit 100 is connected to/from the memory at 104. The first latch circuit 100 has a double-ended input consisting of inputs 110,111 for receiving a double-ended input signal containing the input bit. There is a second latch circuit 102 for latching a value read from the memory as part of the upper page MLC write operation. The second latch circuit 102 has an input 106 that is connected to the non-volatile memory. Among other components, not shown, the second latch 102 has a driving inverter 114. Also shown is an input inverting circuit 112 that produces a complement of the single-ended input signal for use in producing the double-ended inputs 110,111 from the single-ended input signal received via single-ended input 108. One of the components of the input inverting circuit 112 is the first driving inverter 114. Thus, the first driving inverter 114 has two roles—one as part of the second latch circuit 102, and one as part of the input inverting circuit 112 in which it is functioning as a driver. In operation, the access buffer 120 has a first mode of operation in which the input inverting circuit 112 is performing a driving function, producing the complement of the single-ended input signal. A connection 122 is shown between the single-ended input 108 and the input of the first driving inverter 114, and a connection 124 is shown between the output of the first driving inverter 114 and input 110 of the first latch circuit 100. These are shown in dashed lines because there can be other intervening circuitry. Detailed examples of what this intervening circuitry might be are provided below. During the first mode of operation, the input 111 of the first latch circuit 100 receives the single-ended input signal, and the input 110 receives the complement of the single-ended input with the result that inputs 111,110 receive a double-ended input. This mode of operation is used during data loading to the first latch circuit 100.

The access buffer 120 has a second mode of operation in which the second latch circuit 102 is functioning as a latch. During the second mode of operation, the driving inverter 114 participates in the latching functionality being executed by the second latch circuit 102. More specifically, in the context of the specific two phase MLC programming scheme described with reference to FIG. 3, during the second mode of operation, the second latch circuit 102 is used to store the value of the lower page. Then, during programming of the upper page, the value stored in the lower page is used to trigger which verify threshold is used. Referring to FIG. 3, if the value stored in the second latch is a "1", then $V_{verify3}$ is used, and if the value stored in the second latch is a "0", then $V_{verify2}$ is used. This mode of operation is used during programming to the non-volatile memory.

Figure 5:
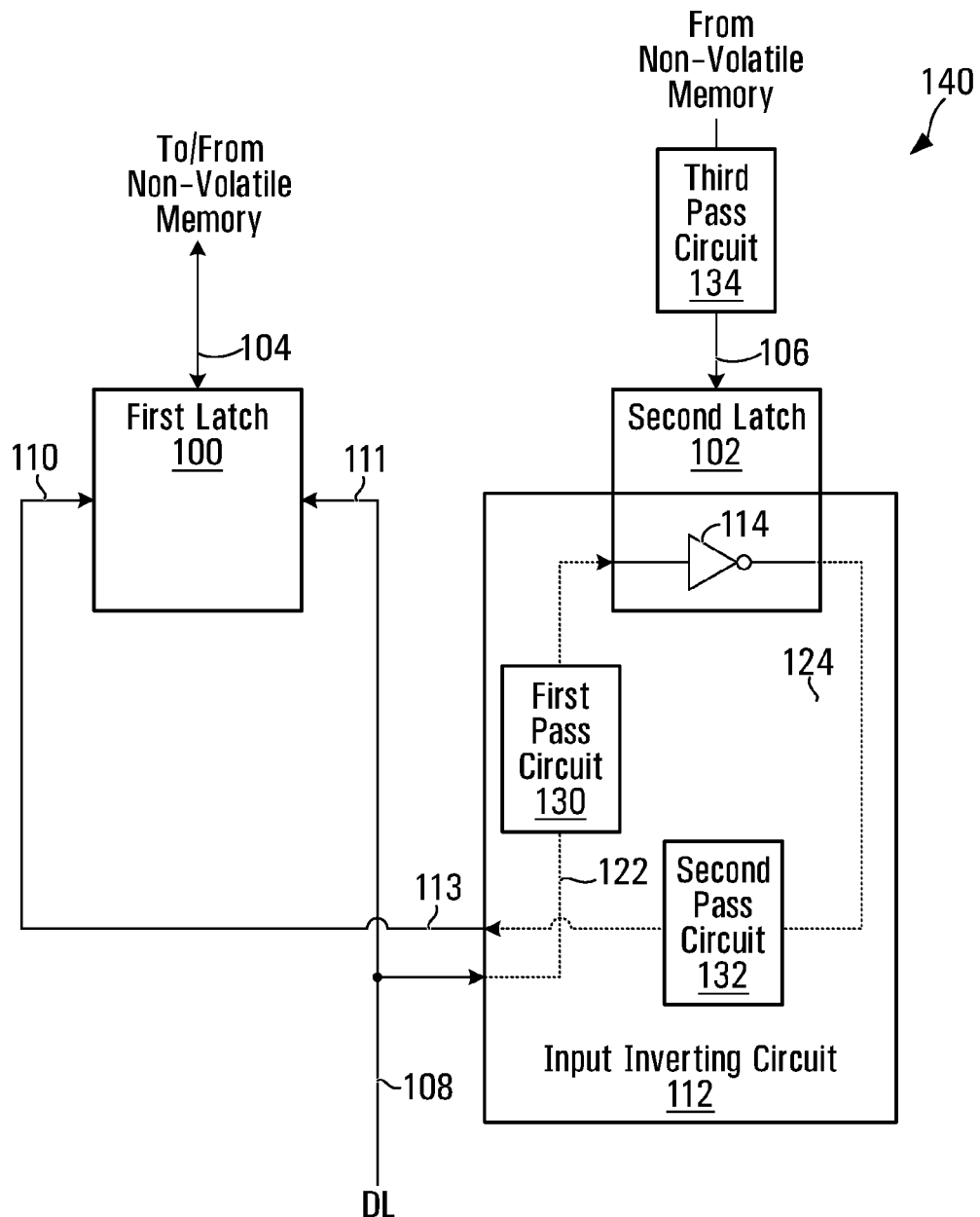
FIG. 5 is a block diagram of another page buffer provided by an embodiment of the invention.

FIG. 5 shows an access buffer according to an embodiment of the present invention. Referring now to FIG. 5, shown is an access buffer 140 that is basically the same as that of FIG. 4, but with certain additions. Specifically, shown is a first pass circuit 130 that passes the single-ended input signal to the input of the first driving inverter 114 while the access buffer 140 is in the first mode, and that prevents passage of the input signal to the first driving inverter 114 while the access buffer 140 is in the second mode. There is a second pass circuit 132 that passes the output of the first driving inverter 114 as one end of the double-ended input signal to input 110 of the first latch circuit 100 while the access buffer 140 is in the first mode, and that prevents passage of the output of the first driving inverter 114 as one end of the double-ended input signal to the first latch circuit 100 while the access buffer 140 is in the second mode. Also shown is a third pass circuit 134 that passes the output of the memory (not shown) to the input 106 of the second latch circuit 102 while the access buffer 140 is in the second mode. While the access buffer is in the first mode, the third pass circuit 134 does not affect the output of the memory. Each of the three pass circuits 130, 132 and 134 has a respective control input (not shown) that controls whether or not the pass circuit passes its respective input signal. More generally a first, second and third signal passer which may or may not be circuits may be employed.

The embodiments of FIG. 4 and FIG. 5 provide an access buffer for use in programming non-volatile memory. Throughout the remainder of description, references are made to page buffers. Page buffers are typically provided for accessing Flash memory. A page buffer is a specific example of an access buffer.

Figure 6:
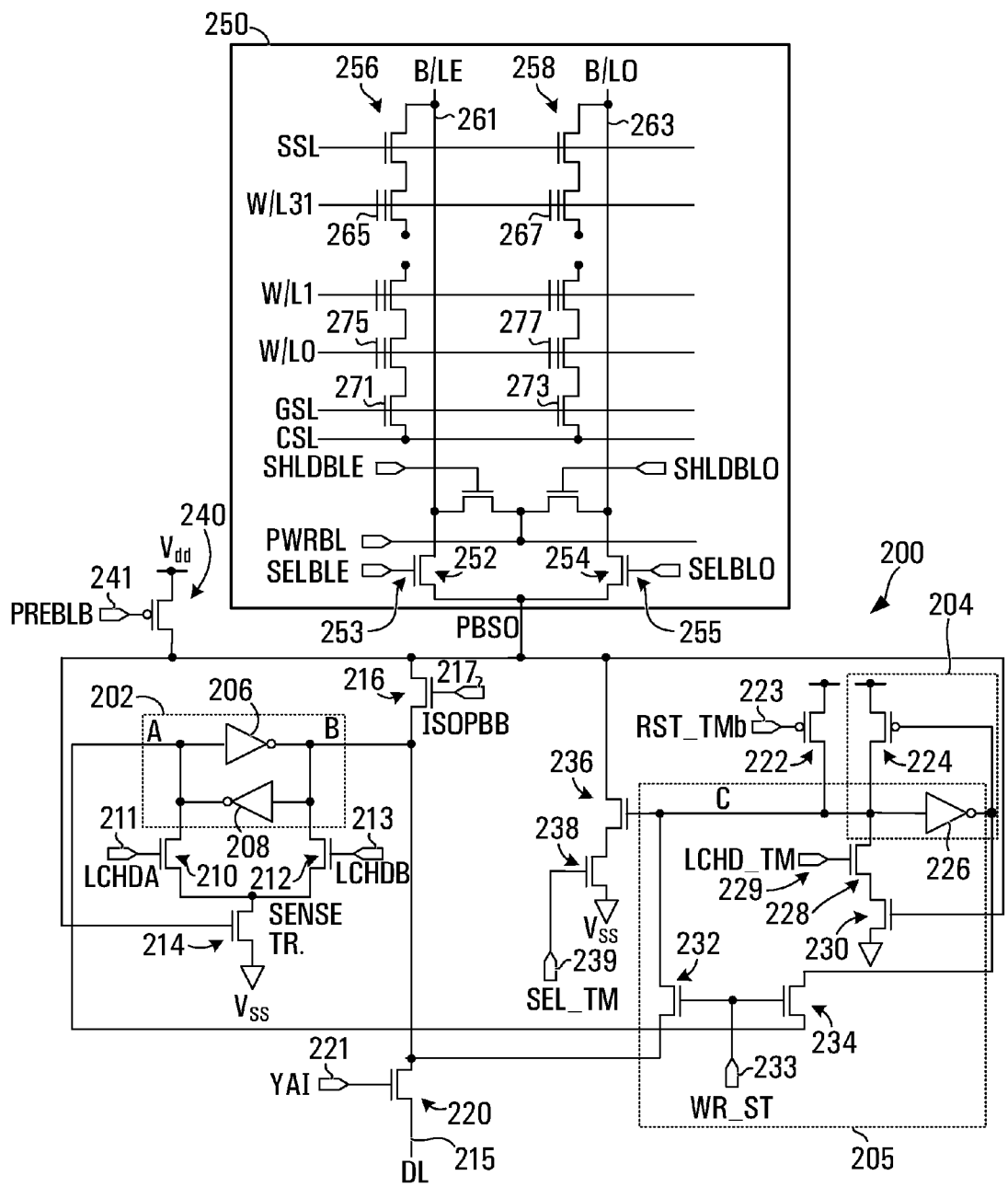
FIG. 6 is a detailed circuit diagram of a page buffer provided by an embodiment of the invention.

FIG. 6 shows a circuit diagram of page buffer provided by an embodiment of the invention, together with circuitry, which is used in memory cell array. This is a specific example implementation of the access buffer of FIG. 4 or FIG. 5. The page buffer is generally indicated at 200 and has a first latch circuit 202 and a second latch circuit 204.

The first latch circuit 202 consists of inverter 206 and inverter 208 connected in a latch configuration. The input to inverter 206 is a node labeled "A" and the input to inverter 208 is a node labeled "B". A data line 215 is connected to node B through transistor 220. The gate of transistor 220 is connected to receive a control input YAI 221. Node A is connected through a transistor 210 to a sense transistor 214. A control input LCHDA (Latch_Data_A) 211 is connected to the gate of transistor 210. Similarly, node B is connected through a transistor 212 to the sense transistor 214. Another control input LCHDB (Latch_Data_B) 213 is connected to the gate of the transistor 212. A PREBLB (Precharge_bitline_bar) control input 241 is connected to the gate of PMOS transistor 240, the drain of which is connected to a node labeled "PBSO" (Post_Bitline_Source_Out) for the purpose of precharging node PBSO, and to the gate of the sense transistor 214. Node PBSO is connected to node B through a transistor 216 that receives a control input ISOPBB 217 at its gate.

The second latch circuit 204 includes a driving inverter 226 (hereinafter, simply "inverter"), and a feedback data holding circuit implemented using a PMOS transistor 224. The input of the second latch circuit 204 is a node labeled "C". A PMOS transistor P1 222 is connected between Vdd and node C for the purpose of pre-charging node C. The gate of transistor 222 is connected to receive a control input RST_TMb (Reset_temporary_bar) 223. The gate of transistor 224 is connected to receive the output of the inverter 226. The inverter 226 and the feedback data holding circuit 224 are connected to form a latch structure.

Node C is connected to the drain of transistor 220 through pass transistor 232 having a control input WR_ST 233 connected to its gate. The output of the inverter 226 is also connected through pass transistor 234 to node A of the first latch circuit 202. Pass transistor 234 also has control input WR_ST 233 connected to its gate. Node C is also connected to the gate of transistor 236. Node PBSO is connected to the drain of transistor 236. The source of transistor 236 is connected through transistor 238 to Vss. The gate of transistor 238 is connected to receive a control input SEL_TM 239. Node C is also connected through transistor 228 to the drain of a transistor 230 to Vss. The gate of transistor 228 receives a control input LCHD_TM (Latch_Data_Temporary) 229. The gate of transistor 230 is connected to Node PBSO. An input inverting circuit 205 includes the inverter 226, and components for selectively connecting the input data line 215 to node A via the inverter 226.

In the illustrated example, circuitry 250 includes two NAND memory cell strings. Each NAND memory cell string includes 32 series-connected floating gate memory cells that are connected to respective wordlines W/L31 to W/L0. The two strings include string select transistors 256, 258 that are connected between bitlines B/LE, B/LO 261, 263 and the respective first floating gate memory cells 265, 267. The string select transistors 256, 258 receive a string select signal SSL commonly. Furthermore, the strings include ground select transistors 271, 273 that are connected between the respective last floating gate memory cells 275, 277 and a common source line CSL. The gates of the ground select transistors receive a ground select signal GSL commonly.

The two bitlines 261, 263 are connected to the page puffer 200 through respective NMOS transistors 252, 254. Transistors 252, 254 have respective gates connected to receive respective control inputs SELBLE (SELBLE (Select_bitline_even) and SELBLO ((Select_bitline_odd) 253, 255 to select one of the two bitlines 261, 263. This enables the same page buffer to service multiple bitlines. More generally, one or more bitlines is connected to each page buffer. The bitlines in the illustrated example have 32 wordlines, but more generally, any number of wordlines can be employed.

A program operation will now be described in some detail. One of two bitlines 261, 263 is selected by appropriate control of SELBLE and SELBLO control inputs 253, 255. The PRE-BLB and RST_TMb control inputs are used to charge the node PBSO and node C with Vdd level, respectively.

First Mode of Operation—Data Loading

During a first mode of operation, data latching in the first latch circuit 202 is performed. Specifically, a bit to be written to the lower or upper page of a memory location is received via DL 215 and stored in the first latch circuit 202.

Data latching is performed after LCHDA 211 is asserted. It is done after PBSO pre-charge with PMOS transistor 240 with PREBLB signal 241. LCHDB 213, and LCHD_TM 229 are not used for this mode.

During data latching, the input received via DL 215 is passed to node B. At the same time, WR_ST 233 is high to enable the input received via DL 215 to pass through transistor 232 to node C, and then through the inverter 226, and back through transistor 234 to node A, thereby producing a double-ended input for the first latch circuit 202 at nodes A and B. The value of the input bit is latched into the first latch circuit 202—Before the data loading operation, A node is discharged to Vss and B node is pre-charged to Vdd with LCHDA 211. After that, LCHDA and LCHDB are not used for data loading operation. Both of them (LCHDA and LCHDB) are for program and erase operations (second mode of operation). During data loading operation, two latch signals (LCHDA and LCHDB) are not required to load program data into the 202 first latch circuit. This is possible because during the data loading step that starts a program operation, the inverter 226 of the second latch circuit 204 does not need to hold any information—it only needs to be able to hold information during an upper page program operation after completing data loading to the first latch circuit 202 of the page buffer as detailed below. The use of a double-ended input for the first latch circuit 202 provides more signal margin than using a single ended input to the latch circuit.

Second Mode of Operation—Page Program Operation

The above-referenced signal 'WR_ST' is activated (that is, high) only for input data loading when page programming starts. After that, during the page program operation, this signal goes back to 'low' state again. For other operations, 'WR_ST' always is low and electrically, node A and the output of inverter 226 are disconnected.

During the second mode of operation, the contents of the first latch circuit 202 are written to a selected memory location. The MLC flash memory cell always starts with a '11', so that it is necessary to perform programming of the cell to change one or both of the lower page and the upper page from a '1' to a '0'. With the particular mapping of bits to threshold distributions described, it is not possible to program the lower page after programming the upper page. Thus, the sequence of programming always progresses from lower page programming followed by upper page programming.

The second latch circuit 204 is used to store the lower page value that is read as part of an upper page program operation. With the stored value, the upper page program threshold level is determined, namely the threshold associated with the transition ('11'→'01') or the threshold associated with the transition ('10'→'00').

The first step in writing to the second latch circuit 204 is to pre-charge node C. This is done with a pulse on control signal RST_TMb through transistor 222 after which transistor 222 is off.

The value read from the low page of the memory location appears on node PBSO. PBSO='H' means that the low page is in the programmed state. Programmed state is used as '0' data. Erase state (Non-programmed state) as '1' data. The actual reading of the value from the memory location can be performed using conventional techniques for reading from non-volatile memory, and the read value appears at node PBSO. A pulse on LCHD_TM causes node C to take on the value from PBSO. The value at node C is then used to control the page program verify operation as detailed below.

Figure 7A:
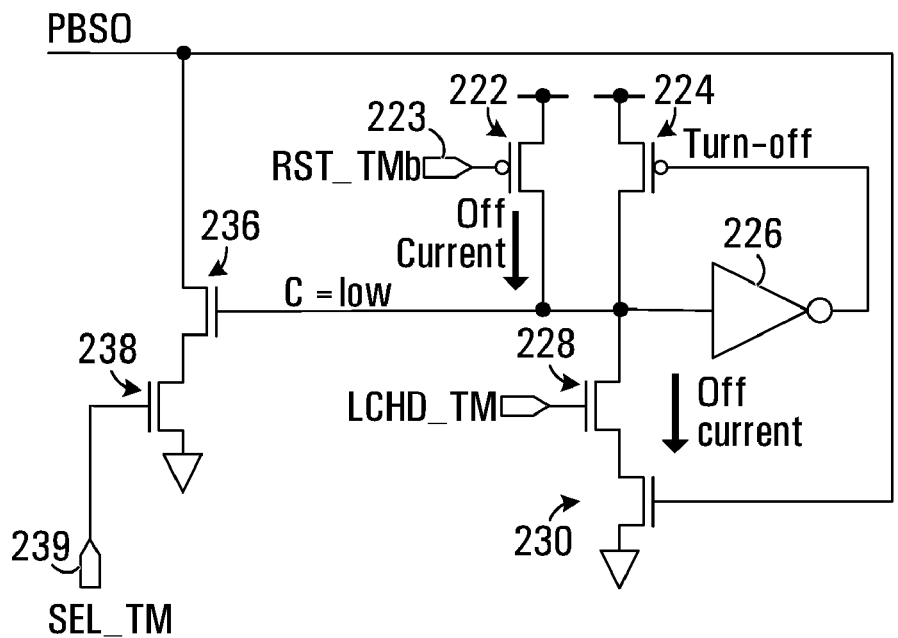
FIGS. 7A, 7B, 7C and 7D show a part of the circuit of FIG. 6 in various operational states.
Figure 7B:
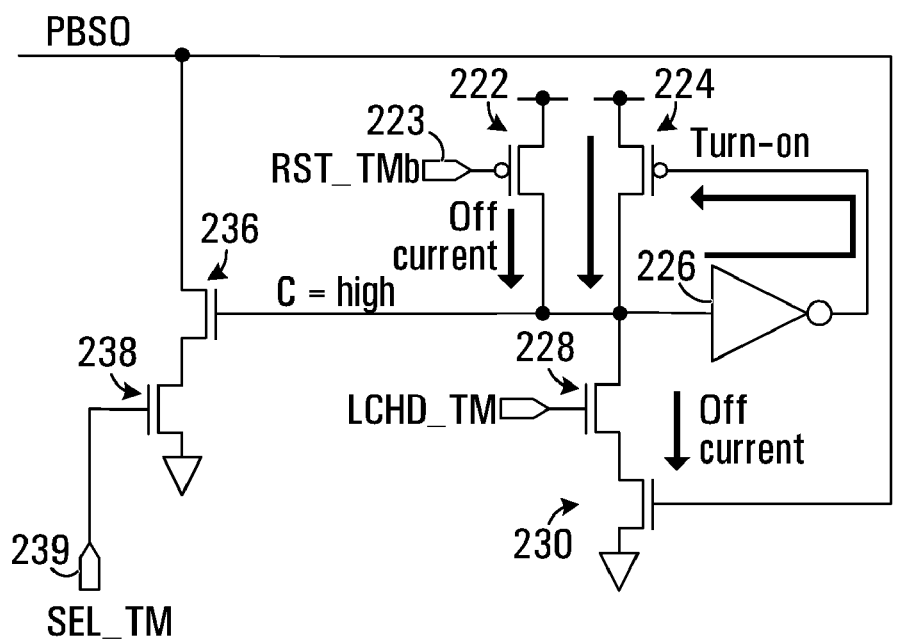

FIG. 7A and FIG. 7B are circuit diagrams showing a portion of the page buffer 200 of FIG. 6 for the purpose of explaining how to compensate leakages for two logic cases of node C.

Figure 7C:
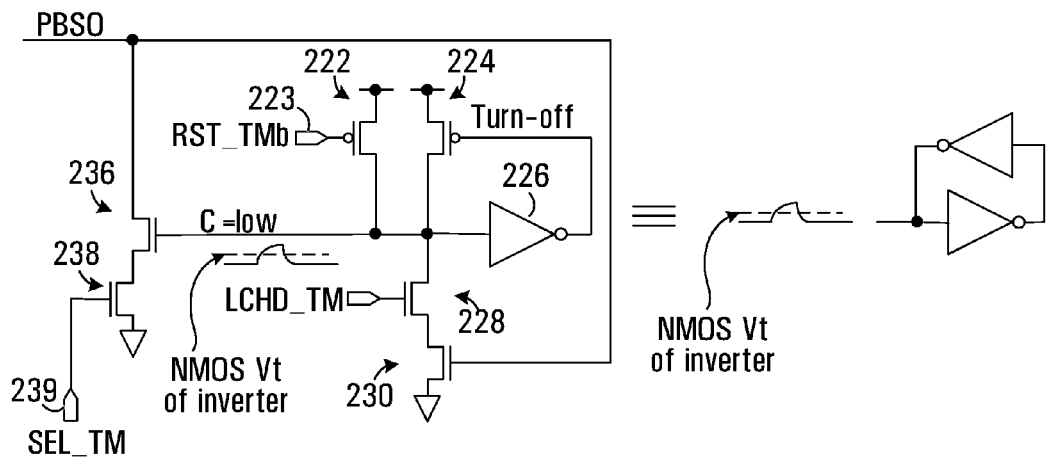
Figure 7D:
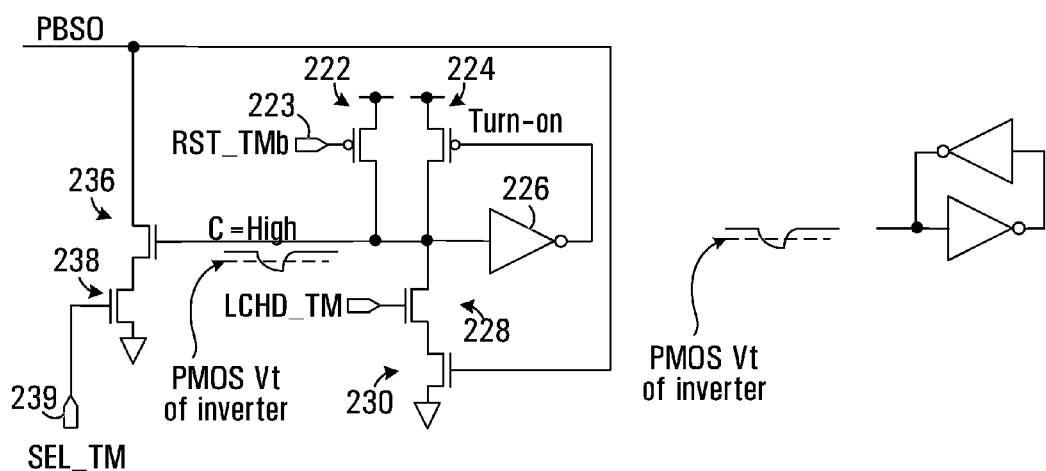

FIG. 7C and FIG. 7D are circuit diagrams showing a portion of the page buffer 200 of FIG. 6 for the purpose of showing a noise immunity comparison between a full latch and the second latch circuit 204 of FIG. 6. Referring first to FIG. 7C, in the event the value read from the low page of memory is a '0', node C is low, and inverter 226 produces an output that turns off transistor 224. While transistor 224 is off, node C is floating in the sense that there is no driving force to hold the 'low' state. However, the 'low' state can be held by the gate capacitance of the inverter 226 and junction capacitance of three transistors (two PMOS 222, 224 and one NMOS 228) along with the gate capacitance of one transistor (NMOS 236). In some embodiments, any possible noise induced into the 'C' node for 'low' state is avoided with an additional capacitor composed with an NMOS transistor to avoid the possibility of a state change by the signal coupling from the adjacent lines and leakage from the PMOS. More specifically, a capacitor may be provided at node C in the event additional capacitance is needed.

Referring next to FIG. 7D, in the event the value read is a '1', node C is high, and inverter 226 produces a low output that turns on transistor 224. Transistor 224 produces a '1' at its drain node (C), and this is consistent with the high state of node C. Thus, the high level of 'C' node is held by feedback latch of inverter 226 and transistor 224.

Page Programming

The page programming operation will be for the lower page or for the upper page. Page programming to the low page does not need the value read from the lower page. In fact, the value will always be 'H' prior to programming. In addition, referring back to FIG. 3, the only valid programming operation for the lower page is from threshold distribution 60 (associated with '11') to threshold distribution 62 (associated with '10'), and there is a single verify voltage, namely $V_{verify1}$ that is used.

Page Programming—Lower Page

The page programming for the lower page is basically the same as page programming to SLC memory except that a different threshold voltage is used. Page programming involves applying a programming voltage to the selected cell (selected in a conventional manner) to increase the threshold voltage of the cell. A verify operation is performed to see if the threshold voltage has increased enough, namely above $V_{verify1}$.

Page Programming—Upper Page

The page programming for the upper page is basically the same as page programming to SLC memory except that different threshold voltages are used. Page programming involves applying a programming voltage to the selected cell (selected in a conventional manner) to increase the threshold voltage of the cell. A verify operation is performed to see if the threshold voltage has increased enough. With reference to FIG. 3, recall that only two programming operations are allowed for upper page programming. One of these is transition 70 from threshold distribution 60 to distribution 66. For this operation, $V_{verify3}$ is used. This transition is possible when the lower page is not programmed. The other of these is transition 71 from threshold distribution 62 to distribution 64. For this operation, $V_{verify2}$ is used. This transition is possible when the lower page is programmed.

After applying the programming voltage to the selected cell, the verify operation starts with a pulse on SEL_TM 239. A two step verify operation takes place. The first verify uses $V_{verify2}$ and the second verify uses $V_{verify3}$. Node C is used to control which verify threshold is used, namely by disabling the result of the first verify operation ($V_{verify2}$) when C is high. When C is low, $V_{verify2}$ is used, and when C is high, $V_{verify3}$ is used.

Figure 8:
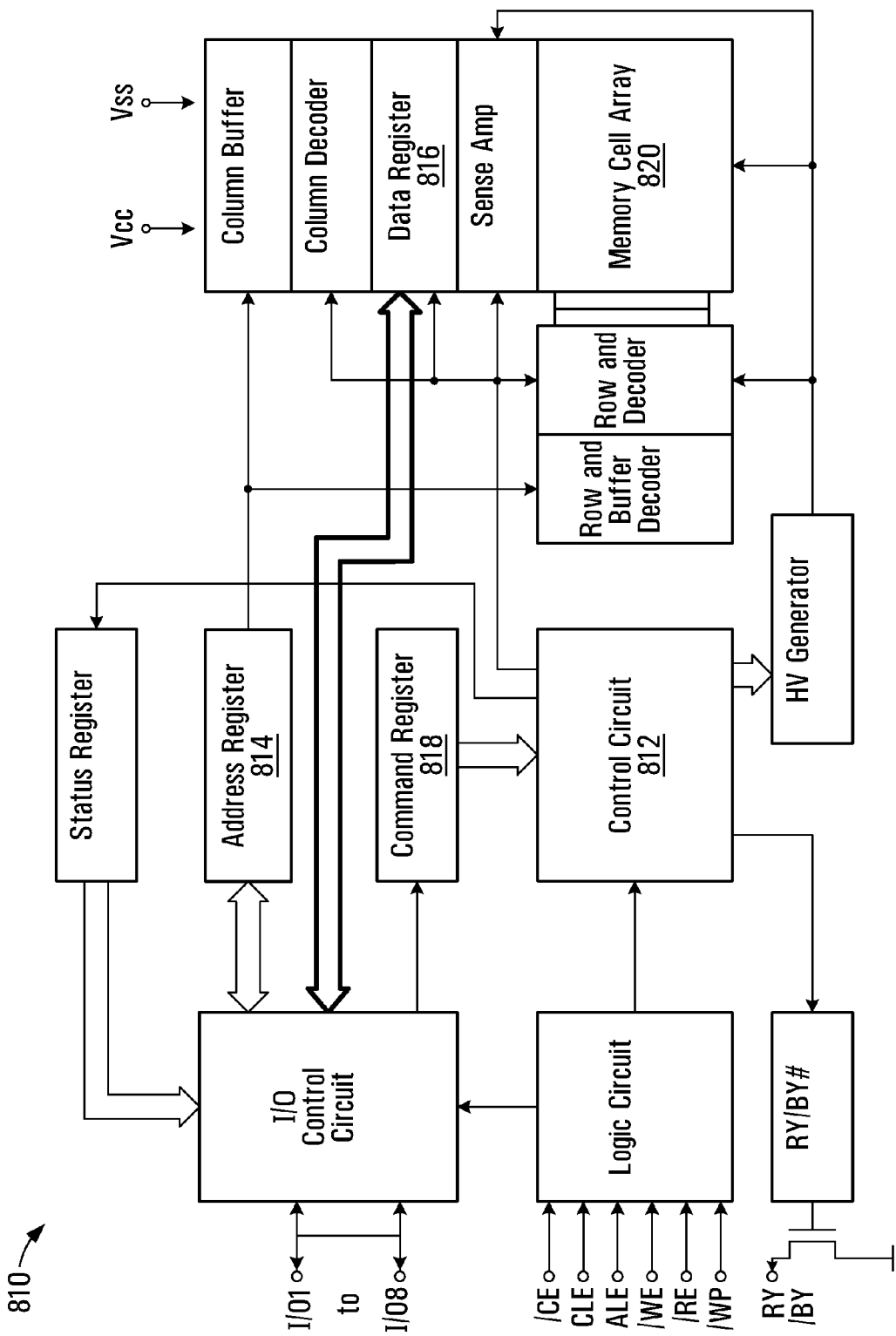
FIG. 8 is a block diagram of a flash memory system to which embodiments of the present invention are applicable.

FIG. 8 shows a flash memory device to which embodiments of the present invention are applicable. Referring to FIG. 8, a flash memory 810 includes logic circuitry such as control circuit 812, for controlling various functions of the flash circuits, an address register 814 for storing address information, a data register 816 for storing program data information, a command register 818 for storing command data information, high voltage circuits for generating the required program and erase voltages, and core memory circuits for accessing a memory array 820. The control circuit 812 includes a command decoder and logic for executing internal flash operations, such as read, program and erase functions. Those skilled in the art will understand that these operations are executed in response to the command data stored in the command register 818, sometimes in combination with the address data and program data stored in the respective address register 814 and data register 816, depending on the operation to be executed. The command data, address data and program data are issued by a memory controller and latched into the corresponding registers by flash memory 810. Basic functions of the shown circuit blocks of flash memory 810 are known in the art. Persons skilled in the art will understand that flash memory 810 shown in FIG. 8 represents one possible flash memory configuration amongst many possible configurations.

For a proper operation of the Flash memory 810, the registers storing address, data and command information have to be reliable. An improper value stored in the register results in device malfunction. For example, varying supply voltages can cause the registers to randomly change states of the information stored in the command register 818, possibly resulting in a bit pattern corresponding to a received program or erase command. In such instances a spurious program operation will cause random data in the data register 816 to be programmed to a random address in the address register 814 of the memory array 820. If data exists at this address, then the memory cells corresponding to that address will be subjected to programming voltages, and their threshold voltages may be changed. A spurious erase operation may result in erasure of existing data in the memory array 820. Because the memory controller is not aware of the spurious operations executed by the flash memory 810, the lost data is irretrievable. The registers of the Flash memory 810 are typically designed with flip-flop circuits having two stable states, for example, D flip-flops.

In the embodiments described above, the device elements and circuits are connected to each other as shown in the figures, for the sake of simplicity. In practical applications of the present invention to page buffer apparatus, circuits, elements, devices, etc. may be connected directly to each other. As well, circuits, elements, devices, etc. may be connected indirectly to each other through other circuits, elements, devices, etc., necessary for operation of the page buffer. Thus, in actual configuration of page buffer apparatus, the circuit, elements, devices, etc. are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

Numerous modifications and variations of the present invention are possible in light of the above teachings. It is therefore to be understood that within the scope of the appended claims, the invention may be practiced otherwise than as specifically described herein.

What is claimed is:

1. A dual-mode circuit comprising:
   a latch circuit having a first input and a second input, the latch circuit comprising a driving inverter having the second input;
   the dual-mode circuit having a first mode of operation in which a first signal received at the first input is latched by the latch circuit;
   the dual-mode circuit having a second mode of operation in which a second signal received at the second input is inverted by the driving inverter.

2. The dual-mode circuit of claim 1 further comprising a circuit for:
   enabling the first input while in the first mode of operation;
   disabling the second input while in the first mode of operation;
   disabling the first input while in the second mode of operation;
   enabling the second input while in the second mode of operation.

3. The dual-mode circuit of claim 2 wherein the circuit for enabling the first input while in the first mode of operation, disabling the second input while in the first mode of operation, disabling the first input while in the second mode of operation, and enabling the second input while in the second mode of operation comprises:
- a first pass circuit having a first state in which the first signal is passed to the first input, and having a second state in which the first signal is prevented from being passed to the first input;
- a second pass circuit having a first state in which the second signal is prevented from being passed to the second input, and having a second state in which the second signal is passed to the second input.

4. The dual-mode circuit of claim 3 further comprising:
- a first control input on the first pass circuit for controlling the first pass circuit to be in a selected one of the first state and the second state of the first pass circuit;
- a second control input on the second pass circuit for controlling the second pass circuit to be in a selected one of the first state and the second state of the second pass circuit.

5. The dual-mode circuit of claim 4 further comprising:
- a control circuit configured to generate a first control signal for the first control input so as to control the first pass circuit to be in the first state during the first mode of operation and to be in the second state during the second mode of operation;
- the control circuit further configured to generate a second control signal for the second control input so as to control the second pass circuit to be in the first state during the first mode of operation and to be in the second state during the second mode of operation.

6. The dual-mode circuit of claim 5 further comprising:
- a third pass circuit having a first state in which a signal at an output of the driving inverter is prevented from being passed on, and having a second state in which the signal at the output of the driving inverter is passed on;
- a third control input on the third pass circuit for controlling the third pass circuit to be in a selected one of the first state and the second state of the first pass circuit.

7. The dual-mode circuit of claim 6 wherein:
the control circuit is further configured to generate a third control signal to the third control input so as to control the third pass circuit to be in the first state during the first mode of operation and to be in the second state during the second mode of operation.

8. The dual-mode circuit of claim 7 wherein the second input signal and the signal at the output of the driving inverter together constitute a double ended input signal during the second mode of operation.

9. The dual-mode circuit of claim 1 further comprising:
- a non-volatile memory configured for multi-level cell programming;

wherein the first signal at the first input comprises a value read from a lower page of a memory location of the non-volatile memory for the purpose of setting a validation threshold for a multi-level cell program operation.

10. The dual-mode circuit of claim 9 wherein the second signal at the second input comprises an input signal containing a bit to be written to the non-volatile memory.

11. A method comprising:
- in a first mode of operation, latching a first signal received at a first input of a latch circuit to the latch circuit;
- in a second mode of operation, inverting a second signal received at a second input using a driving inverter that forms part of the latch circuit;
- operating in the first mode of operation some of the time, and operating in the second mode of operation some of the time.

12. The method of claim 11 further comprising:
enabling the first input while in the first mode of operation;
disabling the second input while in the first mode of operation;
disabling the first input while in the second mode of operation;
enabling the second input while in the second mode of operation.

13. The method of claim 12 further comprising:
generating a first control signal to enable the first input while in the first mode of operation, and disable the first input while in the second mode of operation;
generating a second control signal to disable the second input while in the first mode of operation, and enable the second while in the second mode of operation;
generating a third control signal to disable the signal at the output of the driving inverter from being passed on in the mode of operation, and to enable the signal at the output of the driving inverter to be passed on during the second mode of operation.

14. The method of claim 11 further comprising:
reading a value from a lower page of a memory location of a non-volatile memory, and using the value as the first signal;
setting a validation threshold for a multi-level cell program operation based on the value read.

15. The method of claim 11 further comprising:
receiving an input signal containing a bit to be written to the non-volatile memory, the second signal at the second input comprising the input signal.

16. The method of claim 11 further comprising:
using the second input signal and the signal at the output of the driving inverter together as a double ended input signal during the second mode of operation.

* * * * *